US011636904B2

(12) United States Patent
Weinberg et al.

(10) Patent No.: US 11,636,904 B2
(45) Date of Patent: Apr. 25, 2023

(54) ALMOST READY MEMORY MANAGEMENT (71) Applicant: Micron Technology, Inc., Boise, ID (US)

(72) Inventors: Yoav Weinberg, Thornhill (CA); Eric N. Lee, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 79 days.

(21) Appl. No.: 17/229,476

(22) Filed: Apr. 13, 2021

(65) Prior Publication Data

US 2022/0328109 A1 Oct. 13, 2022

(51) Int. Cl.
G11C 11/40 (2006.01)
G11C 16/34 (2006.01)
G11C 16/20 (2006.01)
G11C 7/10 (2006.01)
G11C 16/32 (2006.01)
G11C 16/26 (2006.01)

(52) U.S. Cl.
CPC ........ G11C 16/3409 (2013.01); G11C 7/1063 (2013.01); G11C 16/20 (2013.01); G11C 16/26 (2013.01); G11C 16/32 (2013.01)

(58) Field of Classification Search
CPC ... G11C 16/3409; G11C 7/1063; G11C 16/20; G11C 16/26; G11C 16/32
USPC .................................................... 365/185.24
See application file for complete search history.

(56) References Cited

U.S. PATENT DOCUMENTS

| 10,002,649 | B1* | 6/2018 | Golan | G11C 16/10 |
| 2014/0231954 | A1 | 8/2014 | Lue | |
| 2016/0179386 | A1 | 6/2016 | Zhang | |
| 2018/0373655 | A1* | 12/2018 | Liu | G06F 13/26 |
| 2020/0192455 | A1* | 6/2020 | Kumar | G06F 1/3253 |

FOREIGN PATENT DOCUMENTS

WO 2017074570 A1 5/2017

OTHER PUBLICATIONS

Choudhuri, et al., "Performance Improvement of Block Based NAND Flash Translation Layer", retrieved from https://www.ics.uci.edu/~givargis/pubs/C32.pdf., Sep. 30-Oct. 3, 2007, 6 pages.

* cited by examiner

Primary Examiner — Hoai V Ho
Assistant Examiner — Minh Dinh
(74) Attorney, Agent, or Firm — Brooks, Cameron & Huebsch, PLLC (57) ABSTRACT A method includes determining, via status polling at a first interval, an indicator of an almost ready status of a set of memory cells of a memory device, based on the indicator of the almost ready status, determining the set of memory cells of the memory device is almost ready to complete execution of an operation on the set of memory cells of the memory device, and responsive to determining the set of memory cells of the memory device is almost ready to complete execution of the operation, performing status polling at a second interval.

17 Claims, 5 Drawing Sheets

ALMOST READY MEMORY MANAGEMENT

TECHNICAL FIELD

Embodiments of the disclosure relate generally to memory sub-systems, and more specifically, relate to almost ready memory management.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Aspects of the present disclosure are directed to almost ready memory management, in particular to memory sub-systems that include an almost ready memory management component. A memory sub-system can be a storage system, storage device, a memory module, or a combination of such. An example of a memory sub-system is a storage system such as a solid-state drive (SSD). Examples of storage devices and memory modules are described below in conjunction with FIG. 1, et alibi. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. One example of non-volatile memory devices is a negative-and (NAND) memory device (also known as flash technology). Other examples of non-volatile memory devices are described below in conjunction with FIG. 1. A non-volatile memory device is a package of one or more dice. Each die can consist of one or more planes. Planes can be groups into logic units (LUN). For some types of non-volatile memory devices (e.g., NAND devices), each plane consists of a set of physical blocks. Each block consists of a set of pages. Each page consists of a set of memory cells ("cells"). A cell is an electronic circuit that stores information. A block hereinafter refers to a unit of the memory device used to store data and can include a group of memory cells, a word line group, a word line, or individual memory cells. For some memory devices, blocks (also hereinafter referred to as "memory blocks") are the smallest area than can be erased. Pages cannot be erased individually, and only whole blocks can be erased.

Each of the memory devices can include one or more arrays of memory cells. Depending on the cell type, a cell can be written to in order to store one or more bits of binary information, and has various logic states that correlate to the number of bits being stored. The logic states can be represented by binary values, such as "0" and "1", or combinations of such values. There are various types of cells, such as single level cells (SLCs), multi-level cells (MLCs), triple level cells (TLCs), and quad-level cells (QLCs). For example, a SLC can store one bit of information and has two logic states.

Some NAND memory devices employ a floating-gate architecture in which memory accesses are controlled based on a relative voltage change between the bit line and the word lines. Other examples of NAND memory devices can employ a replacement-gate architecture that can include the use of word line layouts that can allow for charges corresponding to data values to be trapped within memory cells based on properties of the materials used to construct the word lines.

Media management operations can be performed on the memory blocks. Non-limiting examples of media management operations can include error correction operations, wear leveling operations, read disturb mitigation operations, and/or garbage collection operations. Media management operations can be performed in the "foreground" (e.g., during a time when a host is utilizing an interface associated with the memory sub-system and/or in the "background" (e.g., when the host is not utilizing the interface associated with the memory sub-system). Media management operations can be referred to in the alternative as "memory management operations", herein.

Media management operations or other types of operations can occur responsive to a command. For example, a controller can issue a command to perform an operation (e.g., a read operation, a write operation, an erase operation, etc.) on a memory device. However, before the controller can issue a command to the memory device the controller must wait for the memory device to indicate that it is ready to receive a command. For instance, a ready status of a memory device can indicate that the memory device is ready to receive a command. Conversely, a non-ready status of a memory device can indicate the memory device is not ready to receive a command. For instance, a memory device can have (e.g., assert responsive to status polling) a not-ready status while an operation is executing on the memory device.

A status of a memory device can be determined by performing status polling of the memory device. For example, status polling can be performed by sending a read status command to a memory device. The read status command can elicit a response from the memory device such as a response including status information stored in a register associated with a memory device. For example, the register can return binary values, such as a "0" indicating the memory device is not ready (i.e., busy) or can return a "1" indicating that the memory device is ready, among other possible values. For instance, a register can return "0" during an actual programming operation on the memory device and thereby indicate that the memory device is busy.

Some approaches can perform status polling at a regular interval (i.e., the same interval). However, an amount of delay can exist between an occurrence of a ready status of a memory device and the determination of the ready status due to polling at the regular interval. Such delay can degrade memory system performance at least in part due to the memory device remaining idle (e.g., not receiving a command) during the delay.

As such, some other approaches attempt to perform status polling constantly. However, performing status constantly can inherently increase overhead (e.g., bus traffic and/or computation requirements) and thereby can also degrade memory system performance. Further, performing status polling constantly can increase an amount of power-consumption and thereby increase an amount of cost associated with operation of a memory system and/or degrade memory system performance by limiting an amount of power available for other operations/aspects of the memory system and/or a device in which the memory system is included.

Some other approaches attempt to estimate a time of completion of an operation, and then endeavor to perform status polling only at and/or subsequent to the estimated time of completion of the operation. However, such approaches can inaccurately estimate the time of completion of the operation. For instance, such approaches can fail to account for timing variations in operations such as those attributable to different types of memory devices, different architectures of memory devices, and/or different types of operations. Thus, such approaches can also impart delay between an occurrence of a ready status of a memory device and the determination of the ready status via status polling performed at/based on an inaccurately estimated time of completion of the operation.

The latency imparted by such approaches can be undesirable, especially in critical applications and/or in applications in demanding applications in which very high memory sub-system performance is expected. Further, this degraded performance that can be exhibited in such approaches can be further exacerbated in mobile (e.g., smartphone, internet of things, etc.) memory deployments in which an amount of space available to house a memory sub-system is limited in comparison to traditional computing architectures.

Aspects of the present disclosure address the above and other deficiencies of the previous approaches by employing an almost ready status. As used herein, an "almost ready status" generally refers to a condition in which an operation involving memory cells of a memory device is in progress (e.g., executing) and is not yet completed but a current level of completion of the operation satisfies an almost ready threshold, as detailed herein. In this way, a status polling interval can be varied based on an almost ready status (whether a memory device has or does not have an almost ready status) to realize an improved balance of between bus overhead/power consumption and under-utilization of a memory device (e.g., a NAND memory device). For instance, almost ready memory management can improve (e.g., decrease) any delay between an occurrence of a memory device becoming ready (having a ready status) and determination of the ready status by reducing a status polling interval responsive to an almost ready status of the memory device, as compared to approaches that perform status polling at a regular interval/constantly and/or approaches that estimate a time of completion of an operation. Yet, almost ready memory management can also improve (e.g., decrease) an amount of bus traffic/computational overhead and/or decrease power-consumption associated with status polling by the performing status polling at a first interval responsive to a memory device not having an almost ready status, as compared to approaches that perform status polling at a regular interval/constantly and/or approaches that estimate a time of completion of an operation. Thus, memory sub-system performance can be improved in comparison to approaches which do not employ almost ready memory management. Embodiments herein can be applied in mobile memory deployments to further improve the reliability of a memory sub-system deployed in a mobile computing architecture.

As such, the disclosure is directed to almost ready memory management. Almost ready memory management can determine, via status polling at a first interval (e.g., every 50 μs), an indicator of an almost ready status of a set of memory cells of a memory device. Based on the indicator, almost ready memory management can determine the set of memory cells of the memory device is almost ready to complete execution of an operation, and responsive to determining the set of memory cells of the memory device is almost ready to complete execution of the operation, perform status polling at a second interval (e.g., once every 1 μs). As such, almost ready status polling can mitigate delays between a memory device being ready and the determination of the ready status by performing status polling at the more frequent second interval when the set of memory cells is almost ready and yet, can avoid unnecessary increased overhead by performing status polling at a less frequent first interval when memory device is not almost ready. Stated differently, almost ready memory management can provide an improved balance of between bus overhead/power consumption and under-utilization of a memory device (e.g., a NAND memory device) as compared to approaches that do not employ almost ready memory management.

Figure 1:
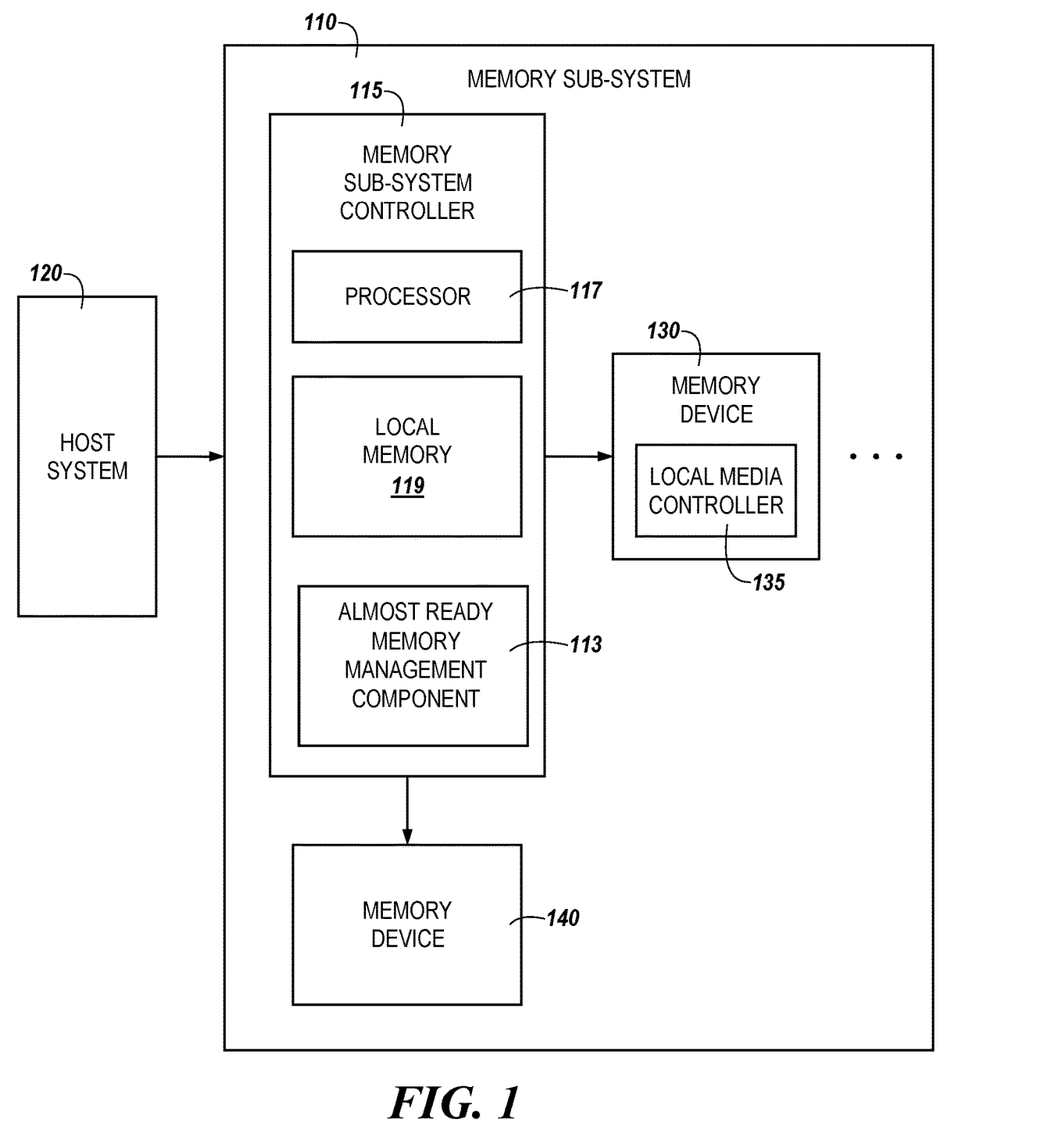
FIG. 1 illustrates an example computing system that includes a memory sub-system in accordance with some embodiments of the present disclosure.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 can include an almost ready memory management component 113. Although not shown in FIG. 1 so as to not obfuscate the drawings, the almost ready memory management component 113 can include various circuitry to facilitate determining, via status polling at a first interval (e.g., every 50 µs), an indicator of an almost ready status of a set of memory cells of a memory device, based on the indicator, determine the set of memory cells of the memory device is almost ready to complete execution of an operation, and responsive to determining the set of memory cells of the memory device is almost ready to complete the operation, perform status polling at a second interval (e.g., once every 1 µs). In some embodiments, the almost ready memory management component 113 can include special purpose circuitry in the form of an ASIC, FPGA, state machine, and/or other logic circuitry that can allow the almost ready memory management component 113 to orchestrate and/or perform operations to determine, via status polling at a first interval, an indicator of an almost ready status of a set of memory cells of a memory device (e.g., such as the memory device 130 and/or the memory device 140), based on the indicator, determine the set of memory cells of the memory device is almost ready to complete execution of an operation, and responsive to determining the set of memory cells of the memory device is almost ready to complete the operation, perform status polling at a second interval.

In various embodiments, the second interval is shorter than the first interval. In some embodiments, the memory sub-system controller 115 includes at least a portion of the almost ready memory management component 113. For example, the memory sub-system controller 115 can include a processor 117 (processing device) configured to execute instructions stored in local memory 119 for performing the operations described herein. In some embodiments, the almost ready memory management component 113 is part of the memory sub-system 110, an application, or an operating system.

In a non-limiting example, an apparatus (e.g., the computing system 100) can include a memory sub-system almost ready memory management component 113, which can be referred to herein as a "almost ready memory management component" 113 or "memory management component" 113 for brevity. The almost ready memory management component 113 can be resident on the memory sub-system 110. As used herein, the term "resident on" refers to something that is physically located on a particular component. For example, the almost ready memory management component 113 being "resident on" the memory sub-system 110 refers to a condition in which the hardware circuitry that comprises the almost ready memory management component 113 is physically located on the memory sub-system 110. The term "resident on" may be used interchangeably with other terms such as "deployed on" or "located on," herein.

The almost ready memory management component 113 can be configured to determine an indicator of an almost ready status of a set of memory cells of a memory device. In some embodiments, the indicator of the almost ready status can be a value stored in a register in a memory device such as the register 221 described in FIG. 2. For instance, the almost ready memory management component 113 can be configured to determine, via status polling of a register at a first interval, the indicator (e.g., a value in the status register) of an almost ready status of the set of memory cells of the memory device. In some embodiments, the almost ready memory management component 113 can be configured to perform status polling at the first interval responsive to initiation of an operation such as an operation executing on a set of memory cells of a memory component (e.g., a NAND memory component).

Similarly, the almost ready memory management component 113 can be configured to perform status polling at a second interval, such as second interval that is shorter than the first interval, as detailed herein. For instance, the almost ready memory management component 113 can be configured to perform status polling at a second interval responsive to determining the set of memory cells of the memory device is almost ready to complete execution of the operation. The almost ready memory management component 113 can determine the set of memory cells of the memory device is almost ready to complete execution of the operation during execution of the operation or, in some instances, prior to execution of the operation, as detailed herein. In any case, having the second interval be shorter than the first interval can provide an improved balance of between bus overhead/power consumption and under-utilization of a memory device (e.g., a NAND memory device) as compared to approaches that do not employ an almost ready status and/or status polling based on the almost ready status.

In some embodiments, the almost ready memory management component 113 can be configured to store a value in a register in the memory device to indicate whether cells of a memory device are almost ready to complete execution of an operation. The almost ready memory management component 113 can be configured to store a value in a register based on a type of the operation, a type of the memory cells of the memory device, or both, as detailed herein. In this way, the almost ready memory management component 113 can account for differences in times of completion of different types of operations and/or memory cells to improve memory system function in contrast to approaches that do not employ an almost ready status.

For example, a short operation (e.g., a read operation) can have corresponding value stored in a register to indicate an almost ready status. Examples of short operations include read/write operations, operations involving SLCs, and/or other types of operations which do not include a verification step. Due to the relatively short length of such operations a value can be stored in a register prior to execution of the operation and maintained in the register at least for a duration of the operation to indicate an almost ready status. Storing the corresponding value in a register to indicate the almost ready status prior to execution of the operation and maintaining the value for a at least the duration of the short operation can result in performing status polling substantially at or entirely at the second interval for the duration of the short operation and can thereby reduce any delay associated with determination of a ready status once the short operation is completed.

Conversely, a long operation (e.g., an erase operation) can, at least initially, have a corresponding value stored in a register to indicate a not almost ready status (e.g., a not almost ready status of a set of memory cells on which the long operation is executing/is to be executed on). Examples of long operations include erase operations, operations involving MLCs, TLCs, QLCs, etc. and/or operations which include a verification step. Storing the corresponding value in a register to indicate the not almost ready status prior to execution of the operation and maintaining the value for at least a portion of duration of the long operation can result in performing status polling at least initially at the first interval and can thereby improve efficiencies (e.g., reduce bus traffic/power consumption), while still permitting subsequently performing status polling at the second interval upon determination of an almost ready status and thereby also mitigating any delay associated with determination of a ready status once the long operation is completed.

For instance, the almost ready memory management component 113 can be configured to set a value in the register to indicate whether the cells of the memory device and/or the memory device is or is not almost ready based on a current level of completion of an operation (e.g., a long operation). The almost ready memory management component 113 can determine a current level of completion of an operation (e.g., a long operation) during execution of the operation. The current level of completion of an operation can be equal to a current quantity of cycles and/or a current voltage. Examples of cycles include program/erase and/or verify cycles on a cell on which the operation is executing. The almost ready memory management component 113 can increment a counter or otherwise track a quantity of current cycles. Alternatively, or in addition, the almost ready memory management component 113 can determine a current voltage. For instance, a verification step can be performed by issuing a number of read commands to determine a current voltage of a cell on which the operation is executing.

The almost ready memory management component 113 can compare the current level of completion (e.g., a quantity of current cycles) to an almost ready threshold. The comparison can permit determination whether the current level of completion satisfies an almost ready threshold and thus whether or not to store/alter an indicator of an almost ready status. For instance, when a current level of completion of an operation (e.g., 6 cycles) exceeds the almost ready threshold (e.g., 5 cycles) then the almost ready memory management component 113 can store a value in a register indicative of the almost ready status of a cell on which the operation is executing.

The almost ready memory management component 113 can be configured to determine an almost ready threshold, for instance, based on a type of operation (e.g., read operation, erase operation, etc.) and/or a type of memory cell (e.g., SLC, MLC, etc.) on which the operation is executed on/to be executed on. The almost ready threshold, similar to the current level of completion as detailed herein, can be a threshold quantity of cycles and/or a threshold voltage. For instance, the almost ready threshold can be equal to a threshold quantity of cycles (e.g., 5 cycles). The threshold quantity of cycles can be less than a total quantity of cycles (e.g., 6 cycles) expected to complete the operation. For instance, in some embodiments, the almost ready threshold can equal to a value corresponding to a last cycle in a total quantity of cycles expected to complete the operation, among other possibilities. In some embodiments, the almost ready threshold can be an almost ready threshold voltage. The almost ready threshold voltage can be less than a completion threshold voltage (e.g., a target programming voltage for a cell when an operation is complete).

In some embodiments, an almost ready threshold can be a predetermined value that is included in a table such as look-up table or is otherwise stored or accessible to the memory sub-system. For instance, the almost ready memory management component 113 can be configured to determine an almost ready threshold of an operation to be equal to a stored value (e.g., stored in look-up table) that corresponds to a type of operation and/or a type of memory cell on which the operation is executed on/to be executed on. In this way, the almost ready threshold can account for differences in times of completion for different type of operations and/or a type of memory cells which can improve memory system function in contrast to approaches that do not employ an almost ready status.

As mentioned, the almost ready memory management component 113 can determine whether a current level of completion of an operation satisfies an almost ready threshold. In some embodiments, the almost ready memory management component 113 can determine a current level of completion does not satisfy an almost ready threshold. In such instances, the almost ready memory management component 113 can perform/continue to perform status polling of the memory device at the first interval. Further, the almost ready memory management component 113 can determine, based on performing the status polling at the first interval, an updated current level of completion of the operation. The updated current level of completion can be determined responsive to each status poll performed at the first interval. In this way, an updated level of completion can be compared to the almost ready threshold in a sequential manner until an updated level of completion is determined to satisfy the almost ready threshold. The almost ready memory management component 113 can, responsive to the determining the updated level of completion satisfies the almost ready threshold, perform the status polling of the memory device at the second interval.

In some embodiments, the almost ready memory management component 113 can perform the status polling of the memory device at the second interval at least until determination of a ready status. For instance, the almost ready memory management component 113 can perform the status polling of the memory device at the second interval at least until determination of a ready status as determined responsive to a read status command or otherwise determined.

In some embodiments, the almost ready memory management component 113 can maintain the stored value indicating the almost ready status at least until determination of a ready status. For instance, in some embodiments, the almost ready memory management component 113 can maintain the stored value for at least some period of time following a determination of a ready status.

In some embodiments, a first interval can be greater than 40 microseconds (μs). For instance, the first interval can be in a range from 40 μs to 200 μs. All individual values and sub-ranges from 40 μs to 200 μs are included. For instance, the first interval can be in a range from 40 μs to 200 μs, from 50 μs to 200 μs, from 40 μs to 150 μs, from 50 μs to 100 μs, and/or from 50 μs to 75 μs. In some embodiments the first interval can be substantially equal to 50 μs or can be equal to 50 μs. As used herein, the term "substantially" intends that the characteristic need not be absolute, but is close enough so as to achieve the advantages of the characteristic. For example, "substantially equal to 50 μs" is not limited to values that are absolutely equal to 50. For instance, substantially equal to 50 μs" can be within 0.5%, 1%, 2%, 5%, 10%, or 20% etc. of 50 μs herein.

In some embodiments, the second interval can be less than 40 microseconds μs. For instance, the second interval be in a range from 0.5 μs to 40 μs. All individual values and sub-ranges from 0.5 μs to 40 μs are included. For instance, the second interval can be in a range from 0.5 μs to less than 40 μs, from 1 μs to less than 40 μs, from 1 μs to 20 μs, from 1 μs to 10 μs, from 1 μs to 5 μs, from 1 μs to 2 μs, and/or from 0.5 μs to 1.5 μs. In some embodiments, the second interval can be substantially equal to 1 μs or can be equal to 1 μs. For instance, being "substantially equal to 1 μs" can be within 0.5%, 1%, 2%, 5%, 10%, or 20% etc. of 1 μs.

In some embodiments, the first interval can be at least twice as long as the second interval, the first interval can be at least five times as long as the second interval, and/or the first interval can be at least 10 times as long as the second interval. For instance, the first interval can be fifty times longer than the second interval, among other possible relative values. Having the first interval be at least twice as long as the second interval, at least five times as long as the second interval, and/or at least 10 times as long as the second interval can provide the improved balance of between bus overhead/power consumption and under-utilization of a memory device (e.g., a NAND memory device) as compared to approaches that do not employ an almost ready status.

Figure 2:
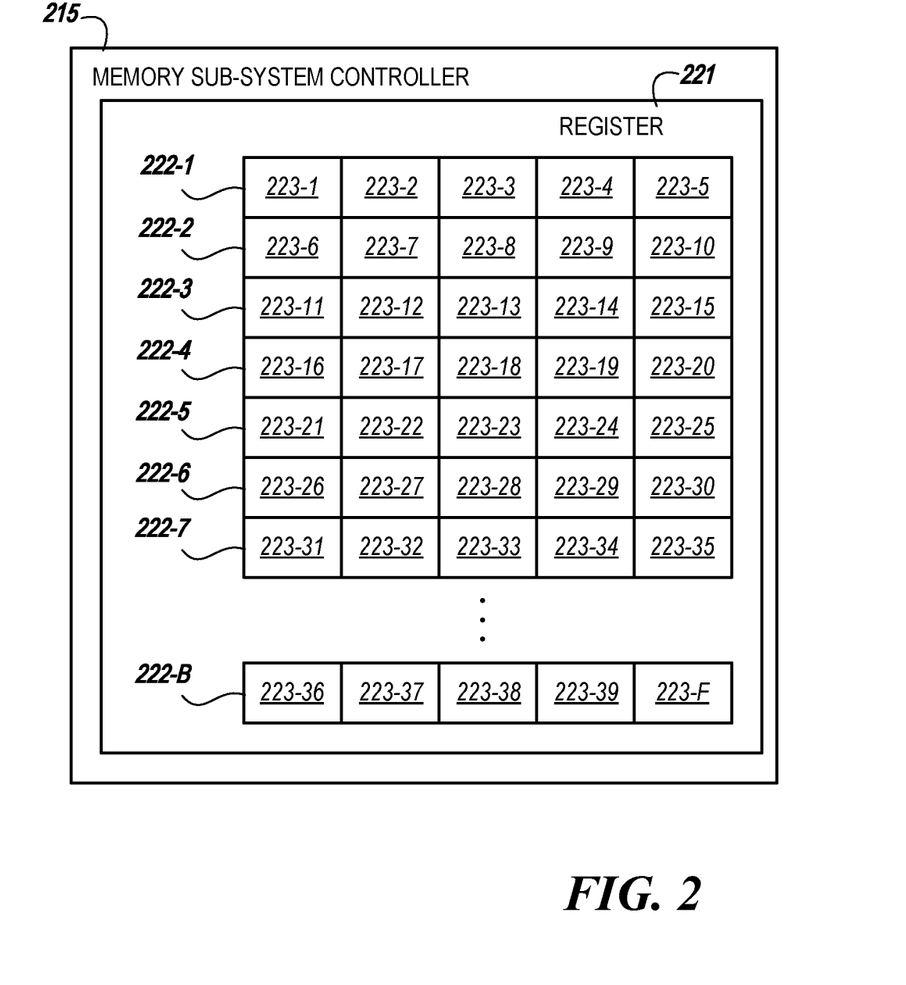
FIG. 2 is an example controller including a register in accordance with some embodiments of the present disclosure.

FIG. 2 is an example controller 215 including a register in accordance with some embodiments of the present disclosure. The register 221 (e.g., a status register) can store status information in accordance with a number of embodiments described herein. In some embodiments, the memory sub-system controller 215 can be analogous to the memory sub-system controller 115 illustrated in FIG. 1. For instance, the register 221 can be included in the local memory 119 as described in FIG. 1, among other possibilities.

As an example, the status information associated with the register 221 can include status information related to program instructions, such as program counter state information, breakpoints, illegal instructions, etc., among various other exceptions. The status information associated with the register 221 can include status information related to error conditions detected in microcode instructions, invalid circuit states, etc. The status information can also comprise control flow information and debug information, among other status information. Notably, in some embodiments, the status information associated with the register 221 can include ready/not ready status information and almost ready/not almost ready status information. The generated status information can be provided (e.g., reported) to a host (e.g., the host 120 as described in FIG. 1).

The register 221 can store status information (e.g., status messages), which can comprise a plurality of bits (e.g., 8 bits, 64, 128, etc.). For instance, as illustrated in FIG. 2, the register 221 can store a total of 8 bits including a first bit 222-1, a second bit 222-2, a third bit 222-3, a fourth bit 222-4, a fifth bit 222-5, a sixth bit 222-6, a seventh bit 222-7, and an eight bit 222-B.

Each bit can have a number of fields 223-1, 223-2, 223-3, 223-4, 223-5, 223-6, 223-7, 223-8, 223-9, 223-10, 223-11, 223-12, 223-13, 223-14, 223-15, 223-16, 223-17, 223-18, 223-19, 223-20, 223-21, 223-22, 223-23, 223-24, 223-25, 223-26, 223-27, 223-28, 223-29, 223-30, 223-31, 223-32, 223-33, 223-34, 223-35, 223-36, 223-37, 223-38, 223-39, to 223-F that can store status information. For instance, the fifth bit 222-5 can include fields 223-21, 223-22, 223-23, to 225-24 that can store status information related to a ready/not-ready status of a set of memory cells of a memory device. The fifth bit 222-5 can store binary values, such as a "0" indicating the memory device is not ready or a "1" indicating that the memory device is ready, among other possible values. Notably, a value of a bit can correspond to almost ready status information. For instance, in some embodiments, the fourth bit 222-4 can store binary values, such as a "0" indicating the memory device is not almost ready or can store a "1" indicating that the memory device is almost ready, among other possible values.

While described herein as storing the ready status information at the fifth bit 222-5 and storing the almost ready status information at the fourth bit 222-4 such status information can be stored elsewhere such as in a different bit or different collection of bits in the register 221, among other possibilities. Moreover, while FIG. 2 illustrates an individual register 221 having a total of 8 bits with a respective number of fields, it is understood that a total number of registers, bits, and/or fields can be increased or decreased.

Figure 3:
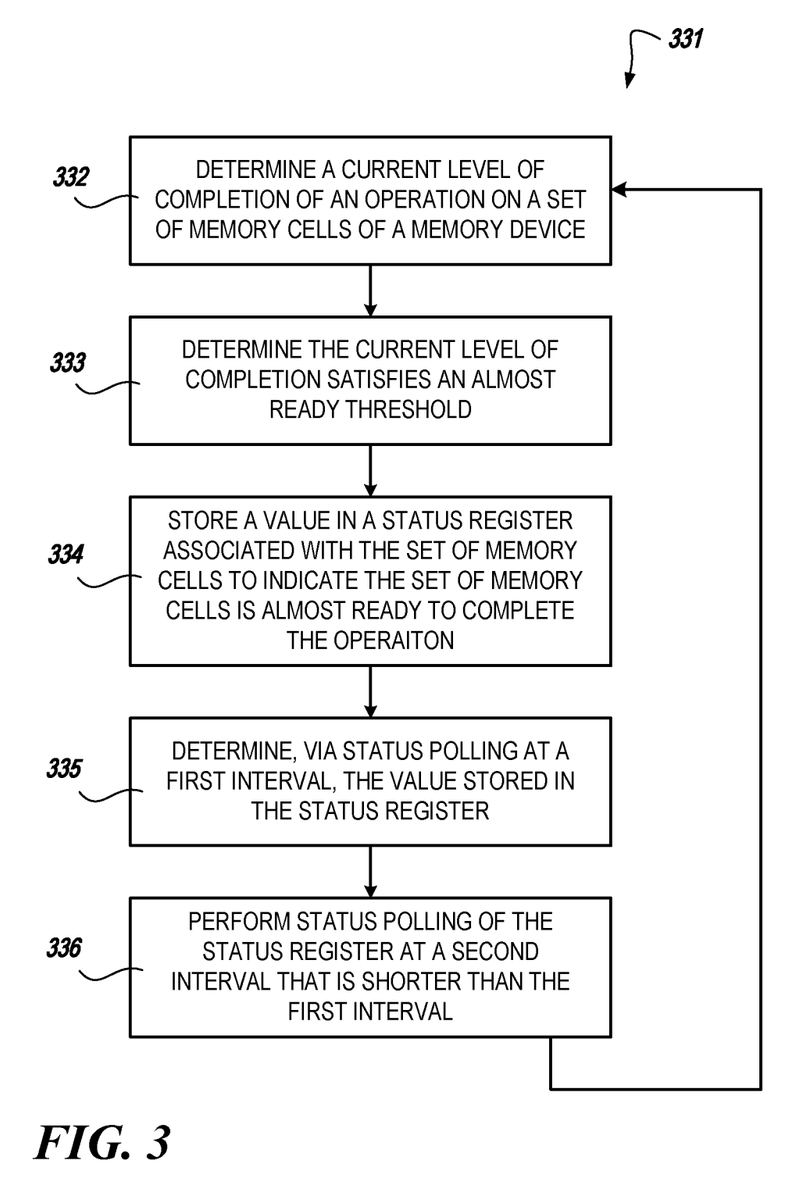
FIG. 3 is a flow diagram corresponding to almost ready memory management in accordance with some embodiments of the present disclosure.

FIG. 3 is a diagram of a flow 331 corresponding to almost ready memory management in accordance with some embodiments of the present disclosure. For instance, flow 331 can be applicable at least to long operations, as detailed herein. At operation 332, a current level of completion of an operation on a set of memory cells of a memory device can be determined. The current level of completion of the operation can be determined by an almost ready memory management component, such as the almost ready memory management component 113 illustrated in FIG. 1.

At operation 333, the current level of completion can be determined to satisfy an almost ready threshold, as described herein. In some embodiments, the current level of completion can be determined prior to and/or subsequent to initiation of the operation on the memory device. For instance, for a long operation a current level of completion can be determined at least subsequent to initiation of the operation on the memory device (e.g., during execution of an operation on a set of memory cells of a memory device).

At operation 334, a value can be stored in a register associated with the set of memory cells to indicate the set of memory cells is almost ready to complete the operation. For instance, responsive to the determination the current level of completion satisfies the almost ready threshold, a value can be stored in a register associated with the set of memory cells to indicate the set of memory cells is almost ready to complete the operation.

For instance, at operation 335, the value stored in the register can be determined, via status polling at the first interval. At operation 336, status polling can be performed at second interval that is shorter than the first interval. For instance, responsive to the determination the value stored in the register indicates the set of memory cells is almost ready, status polling can be performed at second interval that is shorter than the first interval. In various embodiments, status polling can be performed at the second interval until determination of a ready status and thereby expediate determination of the ready status of the memory device.

In some embodiments, a memory device can be included in a plurality of memory devices. In such embodiments, status polling of a first sub-set of memory devices of the plurality of memory device can be performed at the second interval (e.g., those where an almost ready status threshold is satisfied and/or an indicator indicates an almost ready status) substantially concurrently with performing status polling of a second sub-set of memory devices (e.g., those where an almost ready status threshold is not satisfied and/or an indicator indicates a not almost ready status) at a first interval that is less frequent than the second interval. Performing status polling substantially concurrently on a plurality of memory devices at different intervals (e.g., at a first interval or at a second interval) can also improve an overall balance on the memory system between bus overhead/power consumption and under-utilization of a memory device (e.g., a NAND memory device) as compared to approaches that do not employ an almost ready status. Similarly, in some embodiments, status polling of a first sub-set (e.g., a SLC portion of memory cells) of the memory cells of the memory device at the second interval substantially concurrently with performing status polling of a second sub-set of memory cells (e.g., a TLC portion of memory cells) of the memory device at the first interval.

Figure 4:
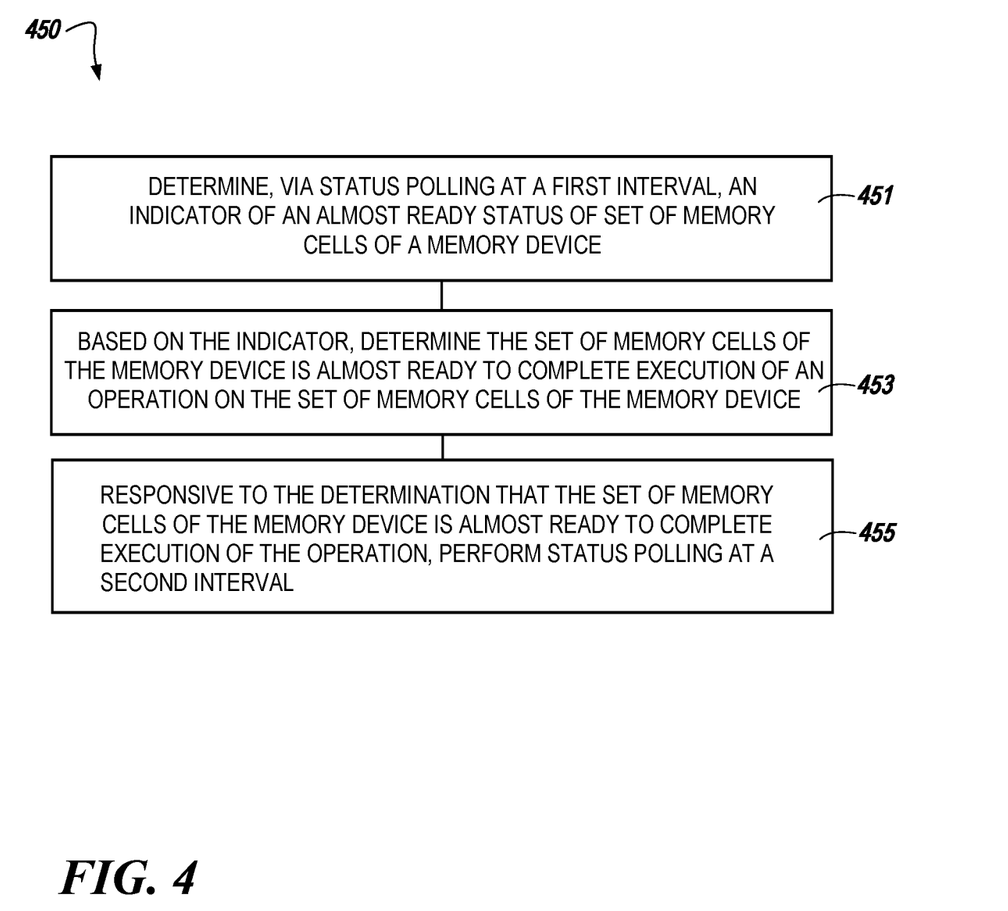
FIG. 4 is a flow diagram corresponding to a method for almost ready memory management in accordance with some embodiments of the present disclosure.

FIG. 4 is flow diagram corresponding to a method 450 for almost ready memory management in accordance with some embodiments of the present disclosure. The method 450 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 450 is performed by the almost ready memory management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 451, an indicator of an almost ready status of a set of memory cells of a memory device can be determined via status polling at a first interval. The memory device can be a memory device such as memory device 130, 140 illustrated in FIG. 1, herein. In some embodiments, the method 450 can include determining an indicator of an almost ready status of a set of NAND memory cells (e.g., one or more blocks of NAND memory cells) in a memory sub-system. As described above, the memory components can be memory dice or memory packages that are coupled to one another to create an array of memory cells, such as a three-dimensional stackable cross-gridded array of memory cells used by the memory sub-system to store data.

At operation 453, a determination that the set of memory cells of the memory device is almost ready to complete execution of an operation on the set of memory cells of the memory device can be made. For instance, the method 450 can include determining the set of memory cells of the memory device is almost ready to complete execution of an operation on the set of memory cells of the memory device based on the indicator of the almost ready status. As mentioned, the indicator of the almost ready status can, in some embodiments, be a value stored in a register associated with the set of memory cells.

At operation 455, status polling at second interval can be performed (e.g., status polling of a block of NAND memory cells). For instance, status polling at the second interval can be performed responsive to the determining the set of memory cells of the memory device is almost ready to complete execution of the operation. In some embodiments the method 450 can include performance of status polling at the second interval on a respective number of planes, pages, and/or memory dice grouped into a given group of NAND memory cells.

Figure 5:
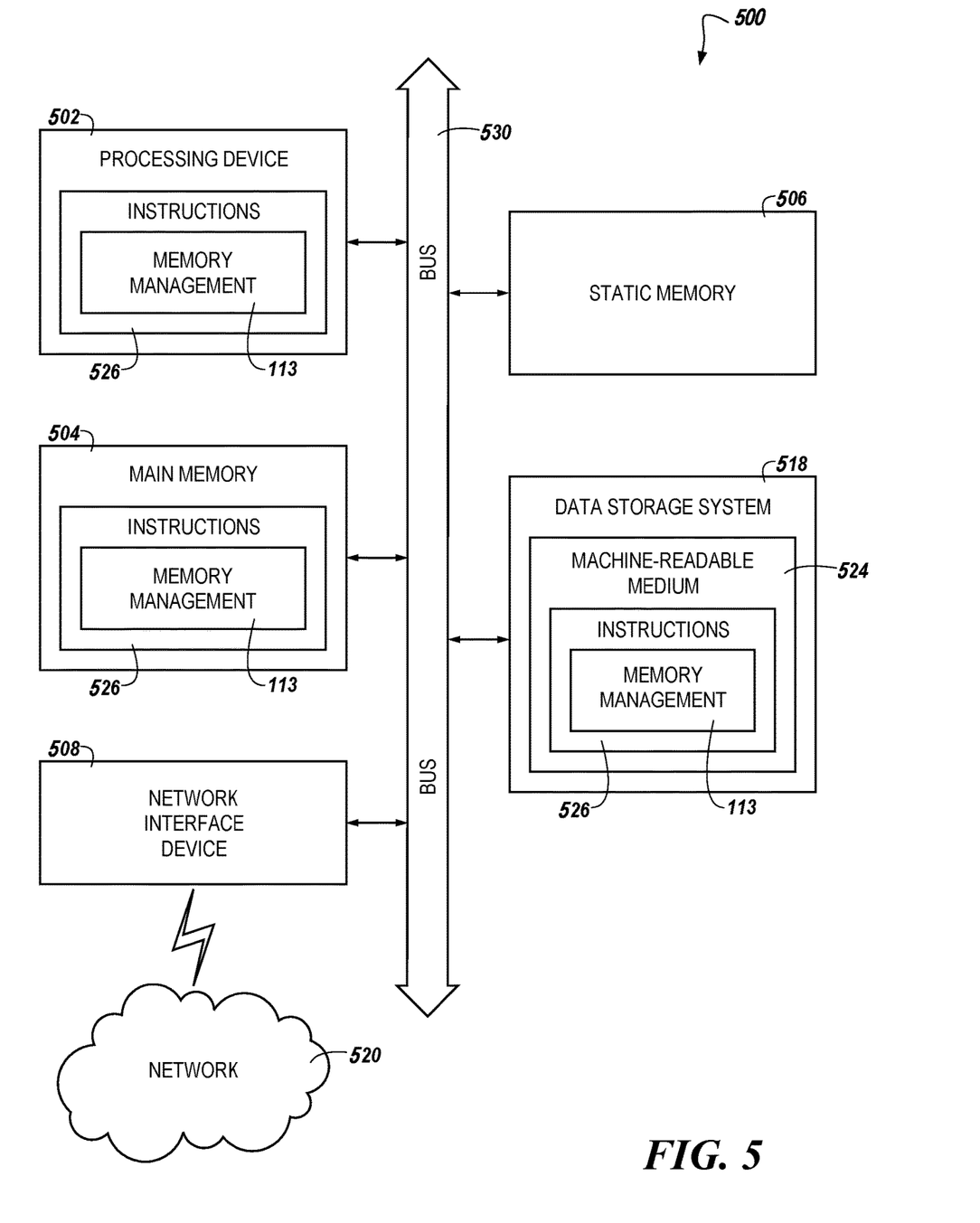
FIG. 5 is a block diagram of an example computer system in which embodiments of the present disclosure may operate.

FIG. 5 is a block diagram of an example computer system 500 in which embodiments of the present disclosure may operate. For example, FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the almost ready memory management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 418, which communicate with each other via a bus 530.

The processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to almost ready memory management component (e.g., the almost ready memory management component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
   determining, via status polling at a first interval, an indicator of an almost ready status of a set of memory cells of a memory device, wherein the indicator further comprises a value in a register in the memory device;
   storing the value in the register based on a current level of completion of an operation on the set of memory cells by:
      determining the current level of completion of the operation satisfies an almost ready threshold;
      responsive to determining the current level of completion of the operation satisfies the almost ready threshold, storing the value in the register;
   based on the indicator of the almost ready status, determining the set of memory cells of the memory device is almost ready to complete execution of an operation on the set of memory cells of the memory device; and responsive to determining the set of memory cells of the memory device is almost ready to complete execution of the operation, performing status polling of the register at a second interval.

2. The method of claim 1, further comprising storing the value in the register based on a type of the operation, a type of the memory cells of the memory device, or both.

3. The method of claim 1, wherein the current level of completion of the operation is a current cycle of a plurality of expected cycles to complete the operation.

4. The method of claim 1, wherein the current level of completion of the operation is a current voltage associated with the memory device.

5. The method of claim 4, wherein the almost ready threshold further comprises an almost ready threshold voltage.

6. The method of claim 5, wherein determining the indicator satisfies the almost ready threshold further comprises determining the voltage associated with the memory device is greater than the almost ready threshold voltage but less than a completion threshold voltage.

7. The method of claim 1, further comprising:
determining the set of memory cells of the memory device is not almost ready to complete execution of the operation; and
performing continued status polling at the first interval.

8. The method of claim 7, further comprising:
determining, based on performing the continued status polling at the first interval, an updated current level of completion of the operation;
determining the updated level of completion satisfies the almost ready threshold; and
responsive to the determining the updated level of completion satisfies the almost ready threshold, performing the status polling of the memory device at the second interval.

9. The method of claim 1, further comprising performing the status polling of the memory device at the second interval at least until determination of a ready status of the memory device.

10. An apparatus, comprising:
an almost ready memory management component configured to:
determine a current level of completion of an operation on a set of memory cells of a memory device;
determine the current level of completion satisfies an almost ready threshold;
responsive to the determination the current level of completion satisfies the almost ready threshold, store a value in a register associated with the set of memory cells to indicate the set of memory cells is almost ready to complete the operation;
determine, via status polling at a first interval, the value stored in the register; and
responsive to the determination the value stored in the register indicates the set of memory cells is almost ready, perform status polling of the register at a second interval that is shorter than the first interval.

11. The apparatus of claim 10, wherein the memory device is a NAND memory device.

12. The apparatus of claim 10, wherein the almost ready memory management component is further configured to:
perform the status polling at the first interval by providing a number of read status commands at the first interval; and
perform the status polling at the second interval by providing a number of read status commands at the second interval.

13. The apparatus of claim 10, wherein the almost ready memory management component is further configured to:
perform status polling of a first sub-set of the memory cells of the memory device at the second interval substantially concurrently with performing status polling of a second sub-set of memory cells of the memory device at the first interval.

14. A system, comprising:
a plurality of memory components arranged to form a stackable cross-gridded array of a plurality of blocks of NAND memory cells; and
a processing device coupled to the plurality of memory components, the processing device to perform operations comprising:
performing status polling of a plurality of registers associated with the plurality of blocks of NAND memory cells at a first interval to determine respective values of the registers;
based on a value stored in a register of the plurality of registers that is associated with a block of NAND memory cells, determining the block of NAND memory cells is almost ready to complete execution of an operation on the block of NAND memory cells; and
responsive to determining the block of NAND memory cells is almost ready to complete execution of the operation, performing status polling of the register associated with the block of NAND memory cells at a second interval.

15. The system of claim 14, wherein the processing device is further to perform the status polling of the register at the first interval responsive to initiation of the operation on the block of NAND memory cells.

16. The system of claim 15, wherein the second interval is substantially equal to 1 μm.

17. The system of claim 14, wherein the first interval is greater than or equal to 40 microseconds (μs), and wherein the second interval is less than 40 μs.

* * * * *